United States Patent [19]

Noufer et al.

[11] Patent Number: 4,490,633
[45] Date of Patent: Dec. 25, 1984

[54] TTL TO CMOS INPUT BUFFER

[75] Inventors: Glenn E. Noufer, Austin; William J. Donoghue, Round Rock, both of Tex.

[73] Assignee: Motorola, Inc., Schaumburg, Ill.

[21] Appl. No.: 335,027

[22] Filed: Dec. 28, 1981

[51] Int. Cl.³ .................. H03K 19/003; H03K 19/094
[52] U.S. Cl. ..................... 307/475; 307/363; 307/443; 307/451; 307/548
[58] Field of Search ............ 307/443, 451, 475, 350, 307/354, 362, 363, 547, 548, 553, 554, 562, 572, 576, 579, 585, 264, 270

[56] References Cited

U.S. PATENT DOCUMENTS

| | | | |
|---|---|---|---|
| 3,675,144 | 7/1972 | Zuk | 307/443 X |
| 3,755,690 | 8/1973 | Smith | 307/475 |
| 3,906,254 | 9/1975 | Lane et al. | 307/475 |
| 4,080,539 | 3/1978 | Stewart | 307/264 |
| 4,216,390 | 8/1980 | Stewart | 307/264 |
| 4,295,065 | 10/1981 | Hsieh et al. | 307/475 |
| 4,307,308 | 12/1981 | Sano | 307/264 X |

*Primary Examiner*—Stanley D. Miller
*Assistant Examiner*—David R. Hudspeth
*Attorney, Agent, or Firm*—Anthony J. Sarli, Jr.; Jeffrey Van Myers; James L. Clingan, Jr.

[57] ABSTRACT

A TTL to CMOS input buffer accomplishes buffering a TTL signal to a CMOS signal without static current flow when the TTL is a logic "1" by isolating the input from an input P channel transistor and using feedback from an input N channel transistor to turn off the P channel transistor. A second P channel transistor is used to couple a positive power supply voltage to the input P channel transistor in response to an output from the N channel transistor.

10 Claims, 2 Drawing Figures

TTL TO CMOS INPUT BUFFER

TECHNICAL FIELD

This invention relates to input buffers, and more particularly to low power input buffers which can level shift TTL inputs to CMOS.

BACKGROUND ART

In complementary metal oxide semiconductor (CMOS) technology a P channel insulated gate field effect transistor IGFET is in series with an N channel IGFET between a positive and a negative power supply terminal so that one of the two transistors is always off in a static condition to prevent current from flowing between the two power supply terminals in the static condition. Being able to detect a transistor transistor logic (TTL) output while keeping one of the P and N channel IGFETs off over the TTL output range is desirable in order to minimize power consumption. To conserve power is a typical reason for using CMOS. Because a TTL output can be as low as 2.0 volts for a logic "1", there is difficulty ensuring the P channel IGFET is off while contemporaneously ensuring the N channel IGFET is on.

When the TTL signal is at 2.0 volts, the P channel IGFET conventionally has its threshold voltage exceeded by a greater magnitude than does the N channel IGFET whereas the desire is for the P channel IGFET to actually be off. The logic "0" presents a substantially less severe problem because the range for a TTL logic "0" is only 0.0 to 0.8 volts. The N channel IGFET may have a sufficiently large threshold voltage that even at a 0.8 volt input the N channel IGFET will be off. Even if it is on, it will be biased on by only several tenths of a volt. This will, however, cause some waste of power because there will be some current flowing in the static condition.

BRIEF SUMMARY OF THE INVENTION

An object of the present invention is to provide an improved TTL to CMOS input buffer.

Another object is to provide a TTL to CMOS buffer with reduced power consumption in a static condition.

Yet another object is to decouple an input signal from at least one of two input terminals and using feedback from an output to prevent static current flow.

The above and other objects and advantages of the present invention are achieved by a TTL to CMOS input buffer for receiving a TTL input signal having one of first and second logic states and for providing an output corresponding thereto. A first transistor which is of a first conductivity type has a control gate for receiving the input signal, a first current electrode coupled to a first power supply terminal, and a second current electrode for providing a first output. A second transistor which is of a second conductivity type has a control gate for receiving the input signal, a first current electrode coupled to a second power supply terminal, and a second current electrode coupled to the second current electrode of the first transistor. A third transistor is interposed between the input signal and the control electrode of the first transistor, and couples the input signal to the control electrode of the first transistor when the input signal is in the first logic state, but decouples the input signal from the control electrode of the first transistor when the input signal is in the second logic state. A fourth transistor is coupled to the control gate of the first transistor and the first output to prevent the first transistor from turning on when the input signal is in the second logic state.

DESCRIPTION OF A PREFERRED EMBODIMENT

Figure 1:
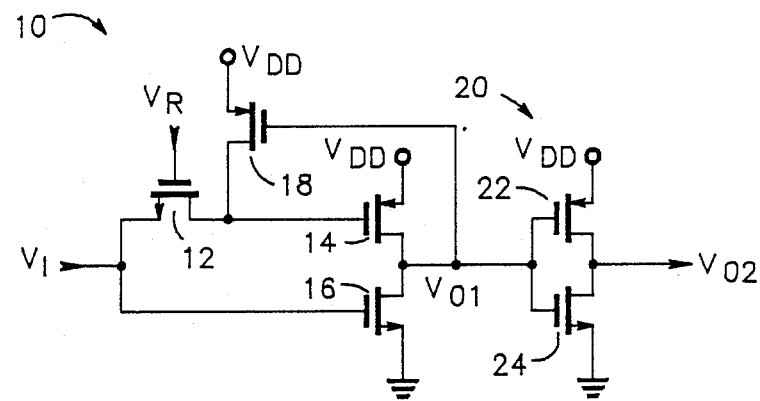
FIG. 1 is a circuit diagram of a TTL to CMOS input buffer, according to a preferred embodiment of the present invention.

Shown in FIG. 1 is a TTL to CMOS input buffer 10 comprised generally of an N channel transistor 12, a P channel transistor 14, an N channel transistor 16, a P channel transistor 18, and an inverter 20. The circuits of FIG. 1 and FIG. 2 have both enhancement N channel insulated gate field effect transistors and enhancement P channel insulated gate field effect transistors. The N channel transistors have a threshold voltage of 0.4 to 0.8 volts. The P channel transistors have a threshold voltage of $-0.4$ to $-0.8$ volts.

Transistor 12 has a source connected to an input terminal for receiving input signal $V_I$, a gate connected to a reference voltage terminal for receiving reference voltage $V_R$, and a drain. Transistor 14 has a gate connected to the drain of transistor 12, a source connected to a positive power supply terminal $V_{DD}$, which can be, for example, 5 volts, and a drain. Transistor 16 has a gate connected to the input terminal for receiving input signal $V_I$, a source connected to a negative power supply terminal, shown as ground, and a drain connected to the drain of transistor 14 to provide a first output voltage $V_{O1}$. Transistor 18 has a gate connected to the drain of transistor 14, a source connected to $V_{DD}$, and a drain connected to the gate of transistor 14. Inverter 20 comprises a P channel transistor 22 and an N channel transistor 24. Transistor 22 has a gate connected to the drain of transistor 14, a source connected to $V_{DD}$, and a drain. Transistor 24 has a gate connected to the gate of transistor 22, a source connected to ground, and a drain connected to the drain of transistor 22 for providing an output of inverter 20 which is a second output $V_{O2}$ of input buffer 10.

Output signal $V_{O2}$ is provided at essentially $V_{DD}$ when input signal $V_I$ is a logic "1" and at essentially ground when input signal $V_I$ is a logic "0". Inverter 20 provides output signal $V_{O2}$ as the complement of output signal $V_{O1}$. Output signal $V_{O1}$ is provided at essentially $V_{DD}$ when input signal $V_1$ is a logic "0" and at essentially ground when input signal $V_1$ is a logic "1". For a TTL signal, a logic "1" is between 2.0 volts and a TTL positive power supply voltage, nominally 5 volts. A logic "0" is between ground and 0.8 volts.

When the input signal $V_I$ is a logic "1" the objective, in order to save power, is for transistor 14 to be off and transistor 16 to be on. This objective is most difficult when the logic "1" is at its lowest voltage, in the case of TTL, 2.0 volts. Reference voltage $V_R$ is chosen so that transistor 12 is off when input voltage $V_I$ is at 2.0 volts. To ensure transistor 12 is off, reference voltage $V_R$ is less than the sum of the lowest voltage of a logic 1 and the smallest threshold voltage $V_{TI2}$ of transistor 12, in this case, 2.0 volts plus 0.4 volt which equals 2.4 volts. Actually, because of body effect with the source of transistor 12 at 2.0 volts, the threshold voltage $V_{TI2}$ will be ensured of being somewhat higher, 0.1-0.2 volts, than 0.4 volts. Consequently with reference voltage $V_R$ less than 2.5 volts, transistor 12 is off when input signal $V_I$ is a logic "1". With input voltage $V_I$ at 2.0 volts, transistor 16 is on which causes output $V_{01}$ to go to essentially ground. Consequently transistor 18 turns on bringing the gate of transistor 14 to essentially $V_{DD}$ so that transistor 14 is off. Consequently there is no current flow for input buffer 10 when input signal $V_I$ is a static logic 1.

When input signal $V_I$ is a logic "0", the objective, in order to save power, is for transistor 14 to be on and transistor 16 to be off. The objective is most difficult when input signal $V_I$ is at its highest logic "0" voltage, transistor 16 has its lowest threshold voltage, transistor 12 has its highest threshold voltage, and transistor 14 its most negative threshold voltage. With input signal $V_I$ at its lowest logic "0" voltage in the case of a TTL signal, 0.8 volt, transistor 12 will turn on if reference voltage $V_R$ exceeds the sum of its maximum threshold voltage $V_{T12}$ and 0.8 volts. There will be some small body effect due to the source of transistor 12 being at 0.8 volts of no more than 0.1 volt so that the maximum threshold voltage $V_{T12}$ is 0.9 volt. Consequently reference voltage $V_R$ is chosen to exceed 0.9 volt plus 0.8 volt which is 1.7 volts, so that transistor 12 will be on coupling the gate of transistor 14 to input signal $V_I$ at 0.8 volt. Transistor 14 turns on causing output $V_{01}$ to go to essentially $V_{DD}$ which turns off transistor 18. With input signal $V_I$ at 0.8 volt, transistor 16 will be slightly on when threshold voltage $V_{T16}$ is only 0.4 volt. Transistor 16 can be made by conventional means to only draw current in the order of 10 microamps under such a condition. Transistor 16 will not cause any significant degradation of output $V_{01}$ because transistor 14 is turned on very hard with its gate at 0.8 volt. It should be noted that the worst case described will not actually occur in a typical process because in a typical process the transistors of the same type, such as transistors 12 and 16, will have the same threshold voltage on the same semiconductor chip. Consequently, when threshold voltage $V_{T12}$ is 0.8 volt, transistor 16 will be off. Likewise, when threshold voltage $V_{T16}$ is 0.4 volt so that transistor 16 is slightly on, transistor 12 will be harder on so as to pull the gate of transistor 14 to 0.8 volt faster. During the transition of input signal $V_I$ from a logic "1" to a logic "0", transistor 12 will draw some current through transistor 18 before transistor 18 turns off. Although transistor 16 will not be completely off in the case where input signal $V_I$, in a logic "0" state, exceeds threshold voltage $V_{T16}$, the current flow is relatively small compared to a typical static current flow of a typical TTL to CMOS input buffer of 350 microamps.

Figure 2:
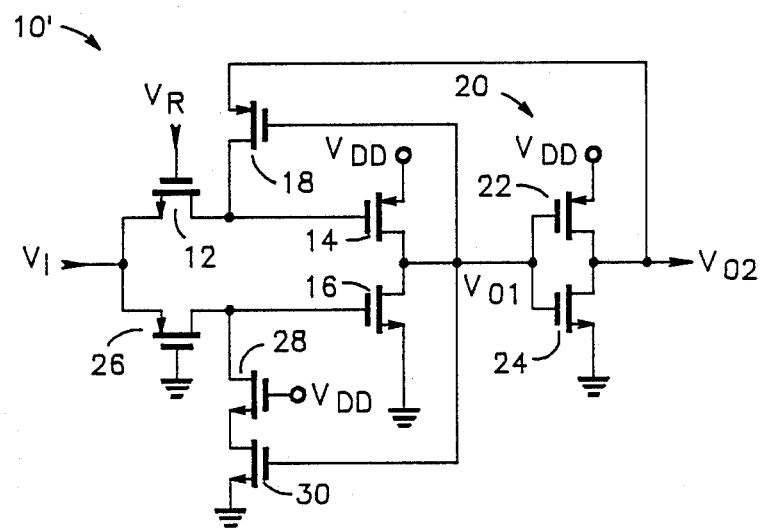
FIG. 2 is the TTL to CMOS input buffer of FIG. 1 in a modified form.

Shown in FIG. 2 is a modified input buffer 10' in which the source of transistor 18 is connected to the drain of transistor 22 ($V_{02}$) instead of directly to $V_{DD}$. The operation is the same except that transistor 18 will turn off faster when input signal $V_I$ makes the transition from a logic "1" to a logic "0" so that there is less current loss through transistor 18 and 12 during that transition. When transistor 12 first turns on, the voltage on the gate of transistor 14, which is supplied by transistor 18, is reduced, causing transistor 14 to turn on. Output voltage $V_{01}$ begins to rise causing output voltage $V_{02}$ to fall. Consequently the gate of transistor 18 is rising in voltage simultaneously with its source falling in voltage which causes transistor 18 to turn off faster reducing current loss. In the transition of input signal $V_I$ from a logic "0" to a logic "1", transistor 12 turns off as transistor 16 begins to turn on harder causing output $V_{01}$ to fall in voltage. Transistor 18 will not turn on, however, because its source is at output voltage $V_{02}$ which is essentially at ground. As output voltage $V_{01}$ falls, output voltage $V_{02}$ will rise. With the gate of transistor 18 falling in voltage and its source rising, transistor 18 will eventually turn on and begin bringing the gate voltage of transistor 14 up. Consequently the voltage on the gate of transistor 14 will essentially track output voltage $V_{02}$. As a result transistor 14 takes longer to turn off for this transition causing more current loss.

If desired, for eliminating static current flow in the logic "1" condition, modified input buffer 10' further comprises a P channel transistor 26, an N channel transistor 28 and an N channel transistor 30. Transistor 26 is interposed between the input terminal for receiving input signal $V_I$ and the gate of transistor 16. Transistor 26 has a drain connected to the gate of transistor 16, a source connected to the input terminal for receiving input signal $V_I$, and a gate connected to ground. Transistor 28 has a drain connected to the gate of transistor 16, a gate connected to $V_{DD}$, and a source. Transistor 30 has a drain connected to the source of transistor 28, a gate connected to the drain of transistor 14, and a source connected to ground. When input signal $V_1$ is at a logic 1, 2.0 to 5 volts, transistor 26 is on, coupling input signal $V_I$ to the gate of transistor 16. Transistor 16 is on so that output voltage $V_{01}$ is at essentially ground so that transistor 30 is off. The operation of modified input buffer 10' is otherwise the same as that for input buffer 10. Consequently there is still no static current flow for the logic "1" condition.

When input signal $V_1$ is a logic "0", the objective is to ensure transistor 16 will be off when input signal $V_I$ is at 0.8 volt. With input signal $V_I$ at 0.8 volt, transistor 26 will either be off or marginally on. Transistor 26 will be marginally on if it has its least negative threshold voltage. With the source of transistor 26 at only 0.8 volt, body effect will result in the least negative threshold voltage being no more negative that $-0.6$ volt in which case transistor 26 will be only marginally on. With input signal $V_I$ at a logic "0", output $V_{01}$ will be at essentially $V_{DD}$ so that transistor 30 will be on. Transistor 28 will be on because its gate is connected to $V_{DD}$. Consequently, transistors 28 and 30 will draw current through transistor 26 reducing the voltage on the gate of transistor 16 safely below 0.4 volt, ensuring transistor 16 will be off. The current drawn through transistor 26 with its source at only 0.8 volt is small, even compared to 10 microamps. Consequently, there is no current flow in a static condition except for that drawn from input signal $V_I$ through transistors 26, 28 and 30. Alternatively, the gate length of transistor 26 can be increased in a conventional manner so that the threshold voltage of transistor 26 will be sufficiently negative to ensure transistor 26 is off even when input signal $V_I$ is at 0.8 volt. Transistor 28 is a relatively small transistor for current limiting during the transition between logic states of input signal $V_I$ when transistor 26 may be turned on hard but output $V_{01}$ is high enough for transistor 30 to be on.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. A TTL to CMOS input buffer for receiving an input signal having one of the first and second logic states and providing an output corresponding thereto, wherein the first logic state is at or below a first predetermined voltage and the second logic state is at or above a second predetermined voltage, said second predetermined voltage being greater than the first predetermined voltage, comprising:

a first transistor, said first transistor being of a first conductivity type, having a first current electrode coupled to a first power supply terminal, a second current electrode for providing a first output, and a control electrode for receiving the input signal;

a second transistor, said second transistor being of a second conductivity type, having a first current electrode coupled to a second power supply terminal, a second current electrode coupled to the second current electrode of the first transistor, and a control electrode for receiving the input signal;

a third transistor, said third transistor being of the first conductivity type, having a control electrode coupled to the second current electrode of the first transistor, a first current electride coupled to the first power supply terminal, and a second current electrode coupled to the control electrode of the first transistor;

a fourth transistor having a threshold voltage, said fourth transistor being of the second conductivity type, having a first current electrode coupled to the control electrode of the first transistor, a second current electrode coupled to receive the input signal, and a control electrode coupled to a reference voltage, said reference voltage is less than the sum of the second predetermined voltage and the threshold voltage of the fourth transistor and greater than the sum of the first predetermined voltage and the threshold voltage of the fourth transistor, so that said reference voltage will turn on the fourth transistor when the input signal is in the first logic state and will turn off the fourth transistor when the input signal is in the second logic state;

a fifth transistor, said fifth transistor being of the first conductivity type, interposed between the input signal and the control electrode of the second transistor and having a first current electrode coupled to receive the input signal, a second current electrode coupled to the control electrode of the second transistor, and a control electrode coupled to the second power supply terminal; and a sixth transistor, said sixth transistor being of the second conductivity type, having a control electrode coupled to the second current electrode of the first transistor, a first current electrode coupled to the second power supply terminal, and a second current electrode coupled to the control electrode of the second transistor.

2. The TTL to CMOS input buffer of claim 1 further comprising a seventh transistor, said seventh transistor being of the second conductivity type, interposed between the second current electrode of the sixth transistor and the control electrode of the second transistor and having a control electrode coupled to the first power supply terminal, a first current electrode coupled to the second current electrode of the sixth transistor, and a second current electrode coupled to the control electrode of the second transistor.

3. The TTL to CMOS input buffer of claim 1 further comprising an inverter coupled between the first and second power supply terminals and having an input coupled to the first output, and an output for providing a second output of the TTL to CMOS input buffer.

4. A TTL to CMOS buffer for receiving an input signal having one of first and second logic states and providing an output corresponding thereto, comprising:

a first transistor, said first transistor being of a first conductivity type, having a first current electrode coupled to a first power supply terminal, a second current electrode for providing a first output, and a control electrode for receiving the input signal;

a second transistor, said second transistor being of a second conductivity type, having a first current electrode coupled to a second power supply terminal, a second current electrode coupled to the second current electrode of the first transistor, and a control electrode for receiving the input signal;

coupling means interposed between the input signal and the control electrode of the first transistor for coupling the input signal to the control electrode of the first transistor when the input signal is in the first logic state and decoupling the input signal from the control electrode of the first transistor when the input signal is in the second logic state;

an inverter coupled between the first and second power supply terminals and having an input coupled to the first output, and an output for providing a second output of the TTL to CMOS input buffer; and a third transistor, said third transistor being of the first conductivity type, having a control electrode coupled to the second current electrode of the first transistor, a first current electrode coupled to the second output, and a second current electrode coupled to the control electrode of the first transistor.

5. The TTL to CMOS input buffer of claim 4 wherein the coupling means comprises a fourth transistor, said fourth transistor being of the second conductivity type, having a first current electrode coupled to the control electrode of the first transistor, a second current electrode coupled to receive the input signal, and a control electrode coupled to a reference voltage, said reference voltage is selected to be a voltage which will turn on the fourth transistor when the input signal is in the first logic state and will turn off the fourth transistor when the input signal is in the second logic state.

6. The TTL to CMOS input buffer of claim 5 wherein the fourth transistor is further characterized as having a threshold voltage, the first logic state of the input signal is further characterized as being at or below a first predetermined voltage, the second logic state of the input signal is further characterized as being at or above a second predetermined voltage, said second predetermined voltage being larger than said first predetermined voltage, and the reference voltage is further characterized as being less than a sum of the second predetermined voltage and the threshold voltage of the fourth transistor and greater than the sum of the first predetermined voltage and the threshold voltage of the fourth transistor.

7. The TTL to CMOS input buffer of claim 6 further comprising:

a fifth transistor, said fifth transistor being of the first conductivity type, interposed between the input signal and the control electrode of the second transistor and having a first current electrode coupled to receive the input signal, a second current electrode coupled to the control electrode of the second transistor, and a control electrode coupled to the second power supply terminal; and a sixth transistor, said sixth transistor being of the second conductivity type, having a control electrode coupled to the second current electrode of the first transistor, a first current electrode coupled to the second power supply terminal, and a second current electrode coupled to the control electrode of the second transistor.

8. The TTL to CMOS input buffer of claim 7 further comprising a seventh transistor, said seventh transistor being of the second conductivity type, interposed between the second current electrode of the sixth transistor and the control electrode of the second transistor and having a control electrode coupled to the first power supply terminal, a first current electrode coupled to the second current electrode of the sixth transistor, and a second current electrode coupled to the control electrode of the second transistor.

9. A TTL to CMOS input buffer for receiving an input signal having one of first and second logic states and providing an output corresponding thereto, comprising:

a first transistor, said first transistor being of a first conductivity type, having a first current electrode coupled to a first power supply terminal, a second current electrode for providing a first output, and a control electrode for receiving the input signal;

a second transistor, said second transistor being of a second conductivity type, having a first current electrode coupled to a second power supply terminal, a second current electrode coupled to the second current electrode of the first transistor, and a control electrode for receiving the input signal;

coupling means interposed between the input signal and the control electrode of the first transistor for coupling the input signal to the control electrode of the first transistor when the input signal is in the first logic state and decoupling the input signal from the control electrode of the first transistor when the input signal is in the second logic state;

feedback means coupled between the second current electrode and the control electrode of the first transistor for turning said first transistor off in response to the input signal being in the second logic state;

a third transistor, said third transistor being of the first conductivity type, interposed between the input signal and the control electrode of the second transistor and having a first current electrode coupled to receive the input signal, a second current electrode coupled to the control electrode of the second transistor, and a control electrode coupled to the second power supply terminal; and a fourth transistor, said fourth transistor being of the second conductivity type, having a control electrode coupled to the second current electrode of the first transistor, a first current electrode coupled to the second power supply terminal, and a second current electrode coupled to the control electrode of the second transistor.

10. The TTL to CMOS input buffer of claim 9 further comprising a fifth transistor, said fifth transistor being of the second conductivity type, interposed between the second current electrode of the fourth transistor and the control electrode of the second transistor and having a control electrode coupled to the first power supply terminal, a first current electrode coupled to the second current electrode of the fourth transistor, and a second current electrode coupled to the control electrode of the second transistor.

* * * * *